(12) United States Patent
Hasegawa et al.

(10) Patent No.: US 6,246,628 B1
(45) Date of Patent: Jun. 12, 2001

(54) SEMICONDUCTOR MEMORY DEVICE HAVING READ/WRITE AMPLIFIERS DISPOSED FOR RESPECTIVE MEMORY SEGMENTS

(75) Inventors: Masatomo Hasegawa; Shinichi Yamada; Satoru Saitoh, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/537,384

(22) Filed: Mar. 29, 2000

(30) Foreign Application Priority Data

May 28, 1999 (JP) .................................................. 11-149249

(51) Int. Cl.$^7$ ...................................................... G11C 8/00
(52) U.S. Cl. ...................................... 365/230.03; 365/233
(58) Field of Search .............................. 365/230.03, 233

(56) References Cited

U.S. PATENT DOCUMENTS

| | | | |
|---|---|---|---|
| 5,748,554 | * | 5/1998 | Barth et al. .................... 365/230.03 |
| 5,883,855 | * | 3/1999 | Fujita ................................... 365/233 |
| 5,926,434 | * | 7/1999 | Mori ..................................... 365/233 |
| 5,946,266 | * | 8/1999 | Iwamoto et al. ...................... 365/233 |
| 5,995,441 | * | 11/1999 | Kato et al. ........................... 365/233 |
| 6,055,208 | * | 4/2000 | Morgan et al. ....................... 365/233 |

\* cited by examiner

*Primary Examiner*—Trong Phan
(74) *Attorney, Agent, or Firm*—Arent Fox Kintner Plotkin (57) ABSTRACT

Segment selection circuits 40A are arranged adjacent read/write amplifiers 20. When one of the segments 0 to 7 in a memory cell array 10 is selected by a signal on segment address lines CA8 to CA6, a read amplifier 21 or a write amplifier 22 of the read/write amplifier 20 corresponding to the selected segment is activated in response to activation of a signal on a read timing signal line RT or a write timing signal line WT. The lines CA8 to CA6, RT and WT are arranged along the row of the segment selection circuits 40A.

9 Claims, 7 Drawing Sheets

SEMICONDUCTOR MEMORY DEVICE HAVING READ/WRITE AMPLIFIERS DISPOSED FOR RESPECTIVE MEMORY SEGMENTS

BACKGROUND OF THE INVENTION

1. Field of the Invention

The present invention relates to a semiconductor memory device having a memory cell array divided into a plurality of segments, and having read/write amplifiers disposed for respective segments.

2. Description of the Related Art

In semiconductor memory devices, there have been demands for reduction in fabrication cost and higher speed of operation by decreasing chip area.

Figure 5:
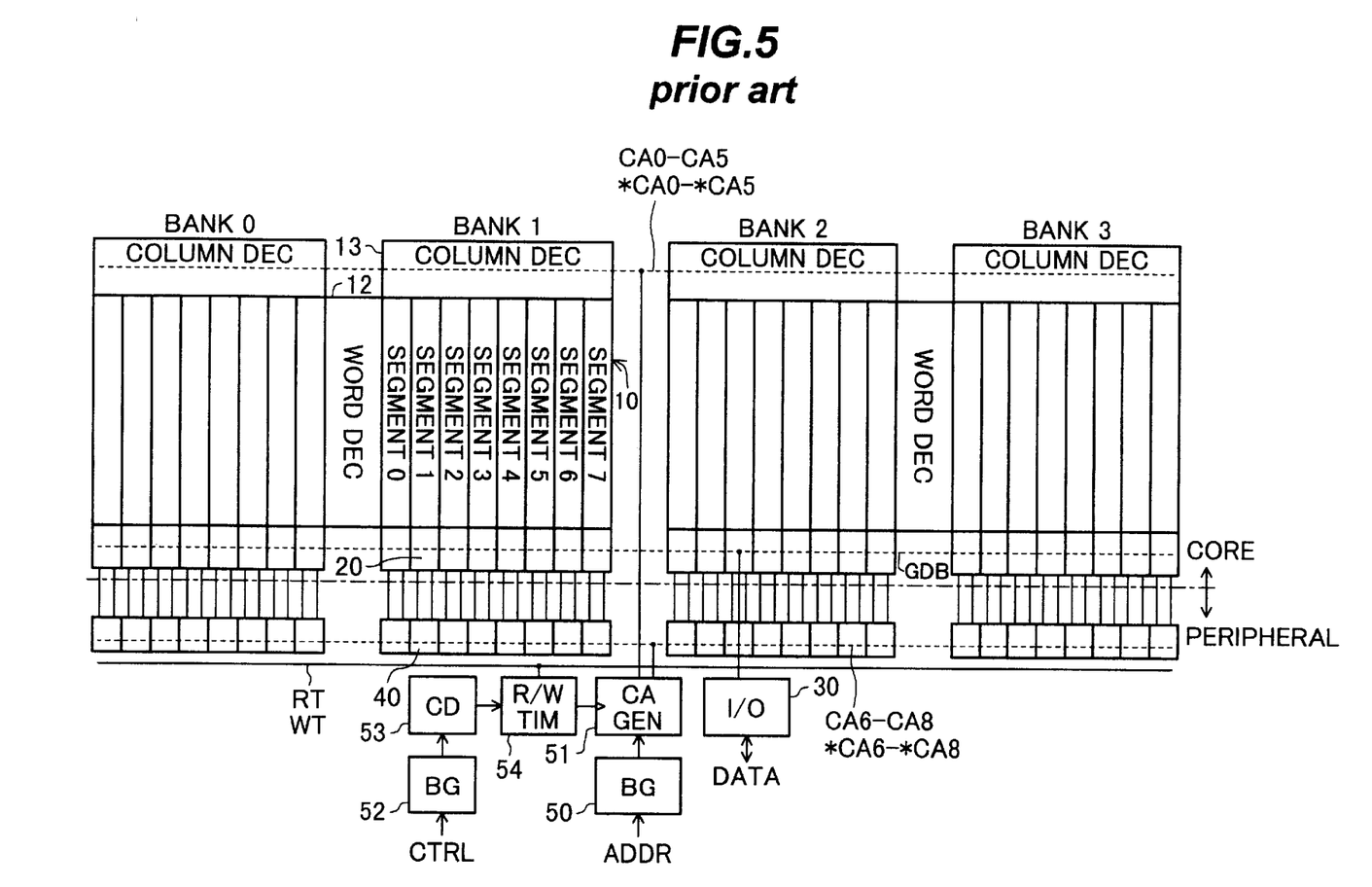
FIG. 5 is a schematic block diagram showing a prior art synchronous DRAM.
Figure 6:
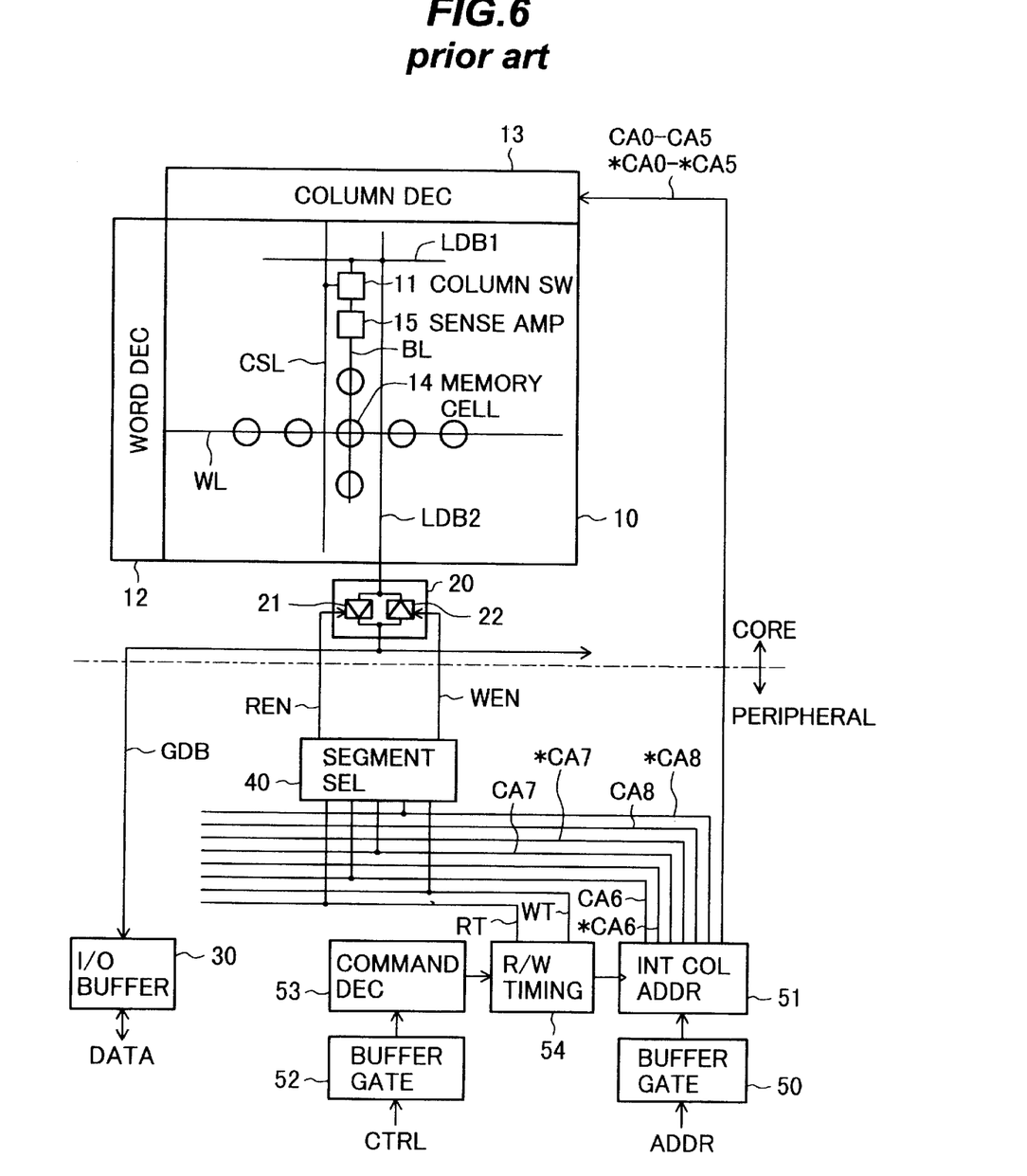
FIG. 6 is a schematic block diagram showing a part configuration of FIG. 5.

FIG. 5 is a schematic block diagram of a prior art synchronous DRAM. FIG. 6 is a schematic block diagram showing a part of FIG. 5.

In FIG. 6, each of local data buses LDB1 and LDB2 and a global data bus GDB is made up of two pairs of complementary signal lines for read and write, or one pair of complementary signal lines in common use for read and write. In a case of the two pairs, a column selection line CSL is made up of a read column selection line and a write column selection line.

For example, when contents of a memory cell 14 in a memory cell array 10 are read, a word line WL is activated to cause a very small change in a voltage of a bit line pair BL depending on the contents of the memory cell 14, and the change is amplified by a sense amplifier 15. Then, the column selection line (CSL) for read or write is activated to turn a column switch 11 on, and the amplified voltage of the bit line pair is transmitted through the local data bus LDB to the local data bus LDB2.

In a read operation, a read amplifier 21 is activated in response to activation of a read enable signal REN, the voltage of the LDB2 is amplified by the read amplifier 21, a resulted voltage is provided through the global data bus GDB to an I/O data buffer circuit 30, and a data signal DATA is externally outputted from the I/O data buffer circuit 30. In a write operation, a write amplifier 22 is activated in response to activation of a write enable signal WEN, the voltage is transmitted in a reverse direction and thereby, data is written on a memory cell 14 selected by an activated word line WL and an activated write column selection line (CSL).

The synchronous DRAM of FIG. 5 is of a multibank architecture, and memory cell arrays of FIG. 6 are provided to respective banks 0 to 3. Each memory cell array is divided into segments 0 to 7 each of which has a plurality of cell columns, and read/write amplifiers 20 are disposed for respective segments.

Referring back to FIG. 6, one segment selection circuit 40 is selected by column address (segment address) signals CA8 to CA6 and their complementary signals *CA8 to *CA6 of the higher order 3 bits outputted from an internal column address generation circuit 51, and the output signal REN or WEN of the segment selection circuit 40 is activated in response to activation of a read timing signal RT or a write timing signal WT from a R/W timing circuit 54.

Figure 7:
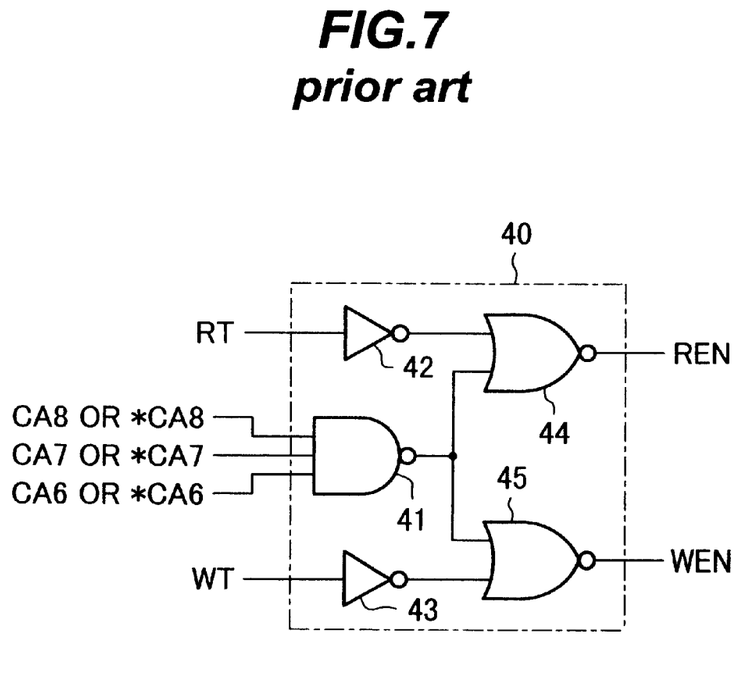
FIG. 7 is a logic circuit of a segment selection circuit of FIG. 6.

FIG. 7 is a logic circuit diagram of the segment selection circuit 40.

Either signal CA8 or *CA8, either signal CA7 or *CA7 and either signal CA6 or *CA6 are provided to a NAND gate 41 depending on a corresponding segment selected by the segment selection circuit 40. For example, in a case of a segment 5, the signals CA8, *CA7 and CA6 are provided to the NAND gate 41. The signals RT and WT are provided to inverters 42 and 43, respectively. The outputs of the NAND gate 41 and the inverter 42 are provided to a NOR gate 44, and the outputs of the NAND gate 41 and the inverter 43 are provided to a NOR gate 45. The signals REN and WEN are respectively outputted from the NOR gates 44 and 45, respectively.

In a state where the three inputs of the NAND gate 41 are all high, its output is low, and in this state, when the read timing signal RT goes high, the output of the inverter 42 goes low, and the read enable signal REN goes high. Likewise, in a state where the three inputs of the NAND gate 41 are all high, when the write timing signal WT goes high, the write enable signal WEN goes high.

Referring back to FIG. 6, since not only the segment address signals CA8 to CA6, but also the complementary signals thereof are provided for segment selection circuits 40, each segment selection circuit 40 for corresponding segment has the same configuration. But, the number of the signal lines for those is large, the segment selection circuits 40 are arranged in the peripheral circuit area apart from the core circuit. Namely, the segment selection circuit 40 has 5 inputs which is larger in number than 2 outputs, the circuit 40 is arranged in the side of the segment address signals CA8 to CA6 and *CA8 to *CA6 to shorten the 5 input lines and to reduce signal line number in the core circuit.

However, since the signal lines REN and WEN are connected to each read/write amplifier 20, in a case of FIG. 5 for example, comparatively long interconnects amounting to 4×7×2=56 in number are laid out between the peripheral circuit and the core circuit, thus causing increase in chip area.

With such comparatively long interconnects, not only the edges of the signals REN and WEN are rounded, but also degrees of roundness of the edges are different in every chip, which reduces a timing margin of the signals. Even if buffer gates are inserted in signal lines to decrease the roundness of the edges, since signal propagation delay time of the gates is newly added, operation speed will reduce.

SUMMARY OF THE INVENTION

Accordingly, it is an object of the present invention to provide a semiconductor memory device, having read/write amplifiers disposed for respective memory segments, whose chip are can be reduced by decreasing the number of interconnections from peripheral circuit to core circuit.

It is another object of the present invention to provide a semiconductor memory device, having read/write amplifiers disposed for respective memory segments, whose operation speed can be higher by sharpening edges of signals on lines between segment selection circuits and respective read/write amplifiers.

In the present invention, there is provided a semiconductor memory device comprising: a memory cell array, having a plurality of segments, each segment having a plurality of bit lines and a local data bus selectively coupled to one of the bit lines; a data input/output buffer circuit connected to a global data bus; read/write amplifiers, disposed for respective segments, each read/write amplifier being between the local data bus of corresponding segment and the global data bus, each read/write amplifier having a read amplifier and a write amplifier; and segment selection circuits, disposed adjacent respective read/write amplifiers, arranged in a row, each for activating corresponding read or write amplifier in response to signals on segment address lines, a read timing signal line and a write timing signal line, wherein the segment address lines, the read timing signal line and the write timing signal line are laid out along the row of the segment selection circuits.

With the present invention, since the segment selection circuits are placed adjacent to respective read/write amplifiers, and the segment address lines, the read timing signal line and the write timing signal line are placed along the row of the segment selection circuits, the number of interconnections between the peripheral circuit and the segment selection circuits in the core circuit is reduced and with this reduction, a chip area can be narrowed as compared with a prior art corresponding case.

Further, since the segment selection circuits are placed adjacent to the read/write amplifiers, the distance between both circuits is reduced as compared with a prior art case, and thereby the rounding of signal edges is reduced, achieving higher speed operation.

Other aspects, objects, and the advantages of the present invention will become apparent from the following detailed description taken in connection with the accompanying drawings.

DESCRIPTION OF THE PREFERRED EMBODIMENTS

Referring now to the drawings, wherein like reference characters designate like or corresponding parts throughout several views, preferred embodiments of the present invention are described below. A signal which is active low will be denoted with adding "*" to a reference character.

First Embodiment

Figure 1:
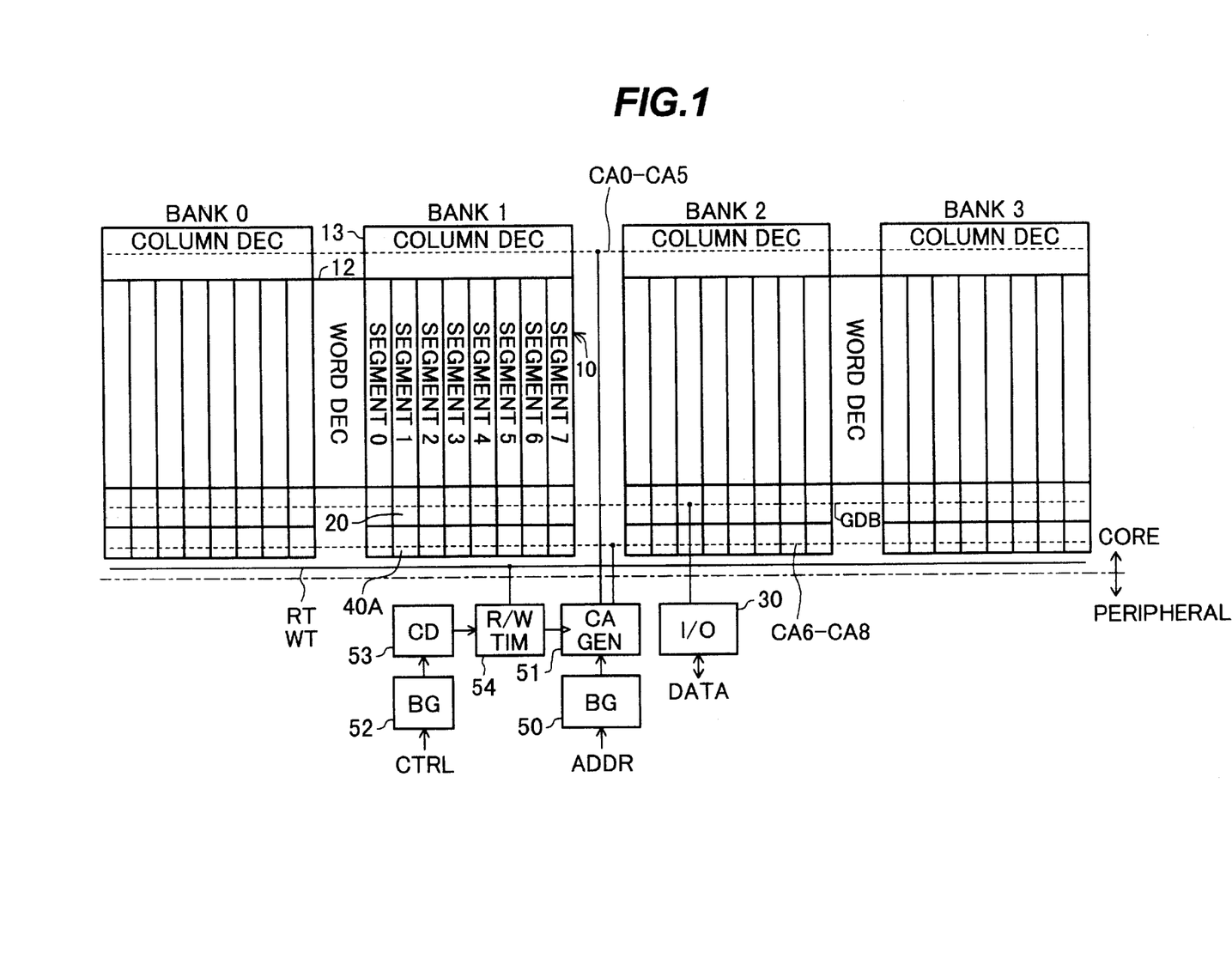
FIG. 1 is a schematic block diagram of a synchronous DRAM of the first embodiment according to the present invention.
Figure 2:
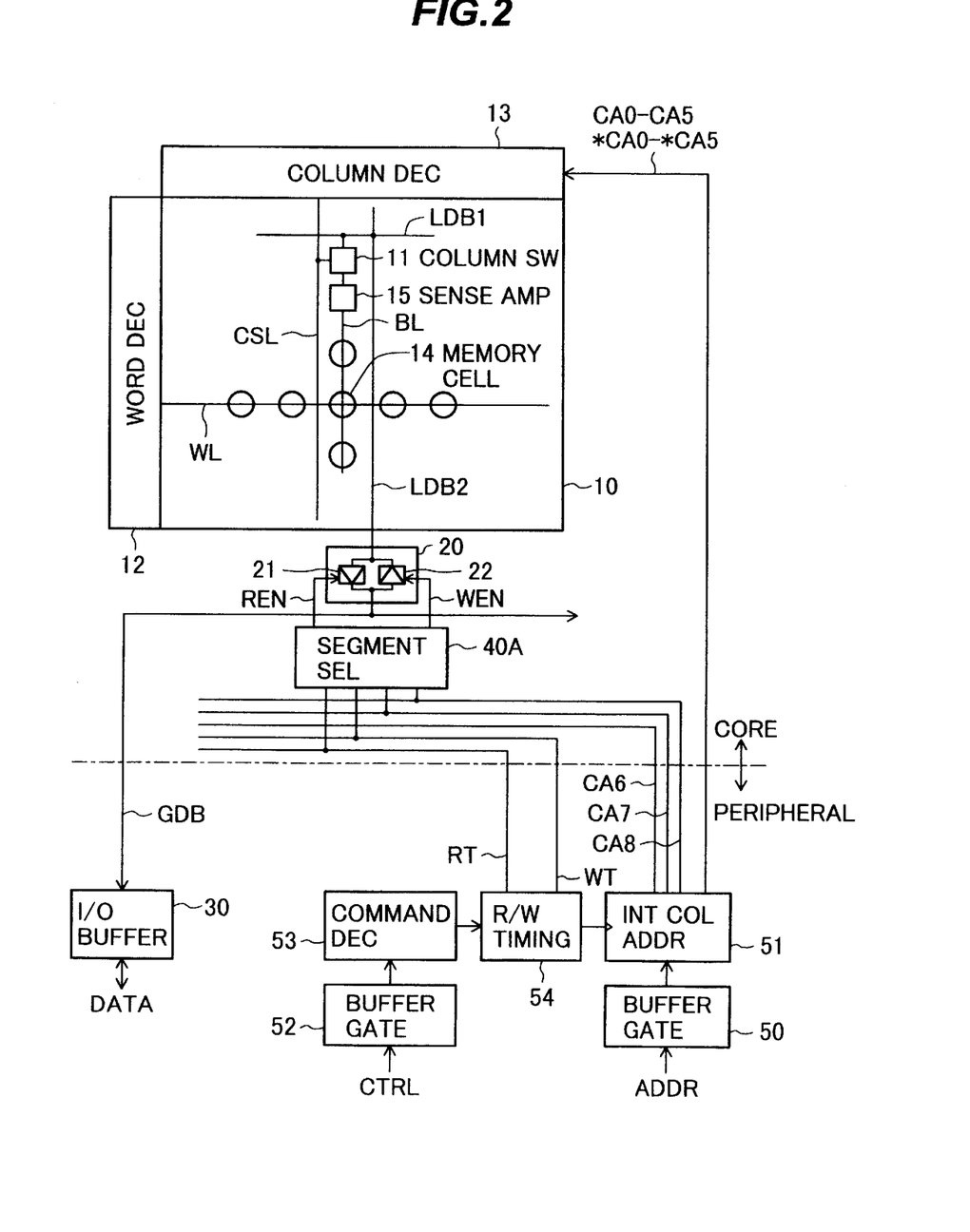
FIG. 2 is a schematic block diagram showing a part configuration of FIG. 1.

FIG. 1 is a schematic block diagram of a synchronous DRAM of the first embodiment according to the present invention, and similar to FIG. 5. FIG. 2 is a schematic block diagram showing a part configuration of FIG. 1, and similar to FIG. 6.

In FIG. 2, each of the local data buses LDB1 and LDB2 and the global data bus GDB is made up of two pairs of complementary signal lines used for read and write, or one pair of complementary signal lines commonly used for read and write. In a case of the two pair, the column selection line CSL is made up of a read column selection line and a write column selection line.

The memory cell array 10 has a configuration in which a plurality of memory cells are arranged in rows and columns, each row includes a word line coupled to the plurality of memory cells, and each column includes a bit line pair coupled to a plurality of memory cells and a column selection lines CSL, for read and write, each for selectively turning on column switch 11 connected between the bit line pair and the local data bus LDBl. In the periphery of the memory cell array 10, a word decoder 12 is placed along one side of the memory cell array 10 and a column decoder 13 is placed along an adjacent side to the one side thereof.

The word decoder 12 selectively activates a word line WL depending on a value of a row address provided, and the column decoder 13 selectively activates a column selection line CSL depending on a value of a column address provided. For example, when contents of the memory cell 14 are read, a word line WL is activated to cause a very small change in the voltage between a bit line pair BL depending on the contents of the memory cell 14, and the change is amplified by the sense amplifier 15. Then, the read column selection line (CSL) is activated to turn the column switch 11 on, and the amplified voltage of the bit line pair is transmitted to the local data bus LDB1. The LDB1 is connected to the local data bus LDB2 extending in a direction perpendicular to the local data bus LDB1.

The read/write amplifier 20 is placed along the side opposite to the column decoder 13. The read/write amplifier 20 includes the read amplifier 21 and the write amplifier 22, and the local data bus LDB2 is connected to the input of the read amplifier 21 and the output of the write amplifier 22. The output of the read amplifier 21 and the input of the write amplifier 22 are connected through the global data bus GBD to the I/O data buffer circuit 30. The read amplifier 21 and the write amplifier 22 are activated by activation of the control signals REN and WEN, respectively, from a segment selection circuit 40A.

In a read operation, the read amplifier 21 is activated while the write amplifier 22 maintains inactive, the voltage of the local data bus LDB1 is amplified by the read amplifier 21 through local data bus LDB2, the amplified voltage is provided to the I/O data buffer circuit 30 through the global data bus GBD, and the DATA is externally outputted from the I/O data buffer circuit 30. In a write operation, the write amplifier 22 is activated while the read amplifier 21 maintains inactive, the signal is transmitted in the reverse direction and the data is written on the memory cell 14 selected by a word line WL and a write column selection line (CSL).

As shown in FIG. 1, the synchronous DRAM is of a multibank architecture, and memory cell arrays are arranged in the banks 0 to 3. Each memory cell array is divided into segments 0 to 7 each of which has a plurality of cell columns. The read/write amplifiers 20 are arranged for respective segments, and local data buses LDB1 and LDB2 of FIG. 2 are provided for each read/write amplifier 20. Further, the segment selection circuits 40A are placed adjacent to respective read/write amplifiers 20. That is, the row of the segment selection circuits 40A is placed next to the row of the read/write amplifiers 20 each as part of the core circuit. With this configuration, since the interconnects of the signals REN and WEN are shorter, the rounding of signal edges decrease, which entails improvement on operating speed.

Figure 3A:
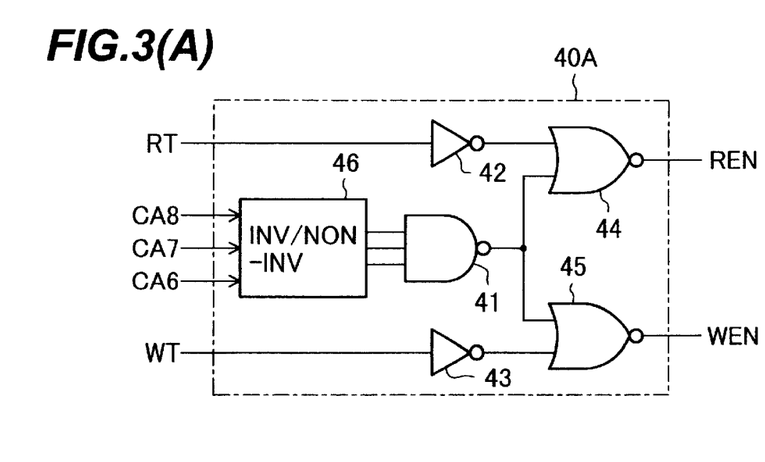
FIG. 3(A) is a logic circuit diagram of a segment selection circuit of FIG. 2.
Figure 3B:
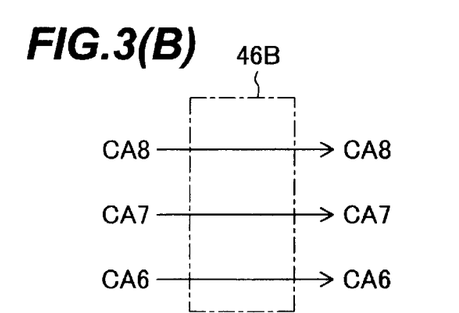
FIGS. 3(B) to 3(E) each are logic circuit diagrams of inversion/non-inversion circuits of FIG. 3(A)
Figure 3C:
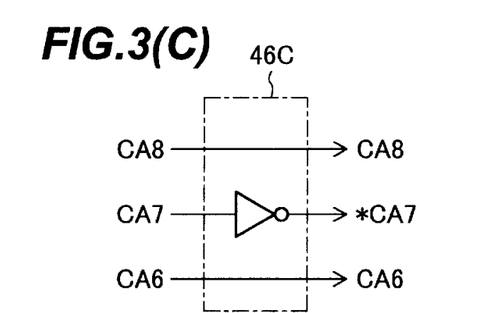
Figure 3D:
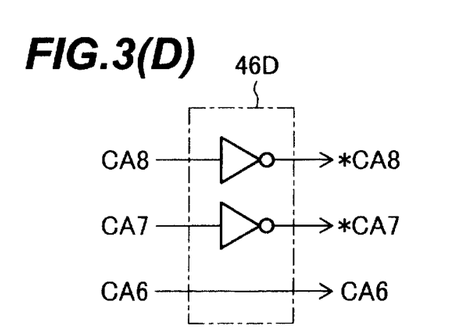
Figure 3E:
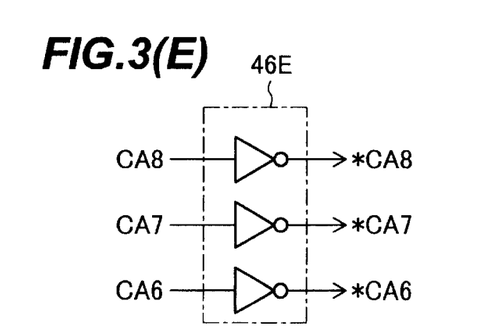

FIG. 3(A) shows an embodiment of the segment selection circuit 40A.

The segment selection circuit 40A is the same as the segment selection circuit 40 of FIG. 7 with the exception that the circuit 40A includes a inversion/non-inversion circuit 46 connected to the preceding stage of the NAND gate 41, and the segment address signals CA8 to CA6 are provided to the inversion/non-inversion circuit 46.

The inversion/non-inversion circuit 46 works for converting the segment address signals CA8 to CA6 to the same ones as the inputs to the NAND gate 41 of FIG. 7. A configuration of the inversion/non-inversion circuit 46 is determined depending on a segment selected by the corresponding segment selection circuit 40A and, as inversion/non-inversion circuits 46B to 46E of FIGS. 3(B) to 3(E) for example, includes 0 to three inverters. The inversion/non-inversion circuits 46B to 46E are used in the segment selection circuits 40A to select the segments 7, 5, 1 and 0, respectively.

Although configurations of the inversion/non-inversion circuits 46 are different depending on respective segment selection circuits 40A, the configurations thereof are simple and further, their occupancy areas are comparatively narrow, and a small drive ability is sufficient in requirement and therefore, only trivial increase in area of the segment selection circuit 40A occurs by the use of the inversion/non-inversion circuit 46. With the use of the circuit 46 in the segment selection circuit 40A, the lines for the segment address signals *CA8 to *CA6 as shown in FIG. 6 becomes unnecessary in the input lines of the segment selection circuit 40A. That is, each of the segment address lines CA8 to CA6 transmits a single phase address signal.

With this and that the segment selection circuits 40A are placed within the core circuit, the required number of the lines from the peripheral circuit to the core circuit for the segment selection circuits 40A is only five. Since the five lines are commonly used for the banks 0 to 3 of FIG. 1, the number of lines, which is five, is greatly reduced as compared with fifty-six in the case of FIG. 5, thereby, enabling a chip area to be narrower than the prior art corresponding case.

Referring back to FIG. 2, in the peripheral circuit, an address signal ADDR provided externally is converted into an internal voltage signal by a buffer gate circuit 50, and the voltage signal is provided to a register in an internal column address generation circuit 51. The circuit 51 includes the register, a buffer gate for amplifying the drive ability of the output thereof, and an inverter for generating the complementary signal thereof.

On the other hand, a control signal CTRL provided externally is provided to a buffer gate circuit 52 to be converted to an internal voltage signal. The CTRL includes a chip select signal *CS, a row address strobe signal *RAS, a column address strobe signal *CAS, a write enable signal *WE, and a clock CLK. A command decoder 53 decodes a combination value of the signals *CS, *RAS, *CAS and *WE on the rise of the clock CLK and outputs the decoded result as a command. If the result is a read or write command, then it is provided to a R/W timing circuit 54. In response to activation of the read or write command, a strobe pulse is provided to the clock input of the register within the internal column address generation circuit 51, thereby, the output of the buffer gate 50 is latched and further, the read timing signal RT is activated at a predetermined elapsed time when the read command have been activated, and the write timing signal WT is activated at a predetermined elapsed time when the write command have been activated.

One of the segment selection circuits 40A is selected by the higher order 3 bits CA8 to CA6 from the internal column address generation circuit 51, and the signal REN or WEN outputted from the segment selection circuit 40A is activated in response to activation of the read timing signal RT or WT from the R/W timing circuit 54, which means one of the segments in the memory cell array 10 has been selected. A column selection line CSL in the selected segment is selected by providing the lower order 6 bits CA5 to CA0 and their complementary signals *CA5 to *CA0 from the internal column address generation circuit 51 to the column decoder 13.

The line length from the internal column address generation circuit 51 and the R/W timing circuit 54 to the segment selection circuit 40A is longer than that of FIG. 5, but by effects of buffer gates of the output stages of the circuits 51 and 54, increase in edge rounding of signals on the lines from the circuits 51 and 54 to the segment selection circuit 40A can be neglected.

Second Embodiment

Figure 4:
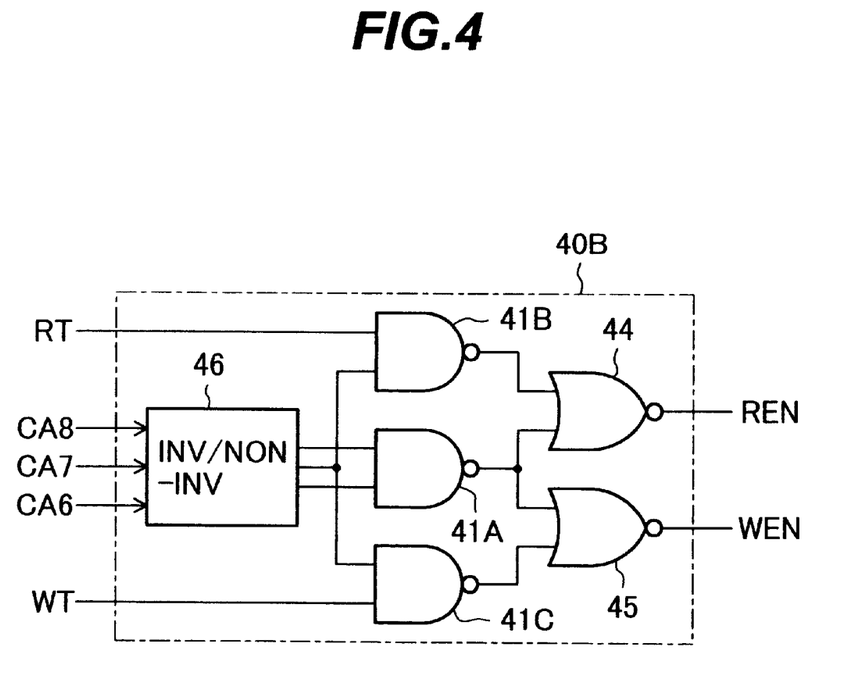
FIG. 4 is a logic circuit of a segment selection circuit of the second embodiment according to the present invention.

The segment selection circuit 40A shown in FIG. 3(A) can functionally be classified into two kinds of circuits. One is a decoder including the inversion/non-inversion circuit 46 and the NAND gate 41, and the other is the rest logic gates. But there is a case where such a classification cannot be performed due to a circuit configuration. FIG. 4 shows a segment selection circuit 40B having such a configuration as the second embodiment according to the present invention.

In this circuit, a 2-input NAND gate 41A is employed instead of the NAND gate 41 of FIG. 3(A), and two 2-input NAND gates 41B and 41C are employed instead of the inverters 42 and 43 of FIG. 3(A). Of three outputs of the inversion/non-inversion circuit 46, two outputs are provided to the NAND gate 41A, and the rest one output is provided to one inputs of the NAND gates 41B and 41C. The signals RT and WT are provided to the other inputs of the NAND gates 41B and 41C, respectively.

When all the three outputs of the inversion/noninversion circuit 46 are a logic '1,' if the read timing signal RT goes high, then the read enable signal REN goes high, while if the write timing signal WT goes high, then the write enable signal WEN goes high.

It should be noted that a device to which the present invention is applied is not limited to a synchronous DRAM having a multibank, but the present invention can be applied to semiconductor memory devices in which read/write amplifiers 20 are disposed for respective segments obtained by dividing the memory cell array 10.

What is claimed is:

1. A semiconductor memory device comprising:
   a memory cell array, having a plurality of segments, each segment having a plurality of bit lines and a local data bus selectively coupled to one of said bit lines;
   a data input/output buffer circuit connected to a global data bus;
   read/write amplifiers, disposed for respective segments, each read/write amplifier being between said local data bus of corresponding segment and said global data bus, each read/write amplifier having a read amplifier and a write amplifier; and
   segment selection circuits, disposed adjacent respective read/write amplifiers, arranged in a row, each for activating corresponding read or write amplifier in response to signals on segment address lines, a read timing signal line and a write timing signal line,
   wherein said segment address lines, said read timing signal line and said write timing signal line are laid out along said row of said segment selection circuits.

2. A semiconductor memory device according to claim 1, wherein said segment address lines are N lines for N bit segment address.

3. A semiconductor memory device according to claim 1, wherein each of said segment selection circuits comprises:
- a decoder for decoding a signal on said segment address lines;
- a first logic circuit, for providing a signal for activating said read amplifier in response to activation of the read timing signal when the output of said decoder is active; and
- a second logic circuit, for providing a signal for activating said write amplifier in response to activation of the write timing signal when the output of said decoder is active.

4. A synchronous DRAM comprising:
a plurality of banks; and
a data input/output buffer circuit, used in common for said banks, connected to a global data bus,
wherein each bank comprises:
- a memory cell array, having a plurality of segments, each segment having a plurality of bit lines and a local data bus selectively coupled to one of said bit lines;
- a data input/output buffer circuit connected to a global data bus;
- read/write amplifiers, disposed for respective segments, each read/write amplifier being between said local data bus of corresponding segment and said global data bus, each read/write amplifier having a read amplifier and a write amplifier; and
- segment selection circuits, disposed adjacent respective read/write amplifiers, arranged in a row, each for activating corresponding read or write amplifier in response to signals on segment address lines, a read timing signal line and a write timing signal line,
- wherein said segment address lines, said read timing signal line and said write timing signal line are laid out along said row of said segment selection circuits.

5. A semiconductor memory device according to claim 2, wherein each of said segment selection circuits comprises:
- a decoder for decoding a signal on said segment address lines;
- a first logic circuit, for providing a signal for activating said read amplifier in response to activation of the read timing signal when the output of said decoder is active; and
- a second logic circuit, for providing a signal for activating said write amplifier in response to activation of the write timing signal when the output of said decoder is active.

6. A semiconductor memory device according to claim 5, wherein said decoder comprises:
- a decoder having the same configuration for each segment selection circuit; and
- an inversion/non-inversion circuit, receiving said signal on said segment address lines, converting the received signal depending on corresponding segment selection circuit to provide to said decoder.

7. A semiconductor memory device according to claim 4, wherein said segment address lines are N lines for N bit segment address.

8. A semiconductor memory device according to claim 7, wherein each of said segment selection circuits comprises:
- a decoder for decoding a signal on said segment address lines;
- a first logic circuit, for providing a signal for activating said read amplifier in response to activation of the read timing signal when the output of said decoder is active; and
- a second logic circuit, for providing a signal for activating said write amplifier in response to activation of the write timing signal when the output of said decoder is active.

9. A semiconductor memory device according to claim 8, wherein said decoder comprises:
- a decoder having the same configuration for each segment selection circuit; and an inversion/non-inversion circuit, receiving said signal on said segment address lines, converting the received signal depending on corresponding segment selection circuit to provide to said decoder.

* * * * *